(12) United States Patent
Lischewski et al.

(10) Patent No.: US 11,211,925 B2
(45) Date of Patent: Dec. 28, 2021

(54) MODULE INCLUDING AN INDICATOR FOR INDICATING A PHYSICAL STATE OF A SENSOR CONNECTED TO THE MODULE

(71) Applicant: WAGO Verwaltungsgesellschaft mit beschraenkter Haftung, Minden (DE)

(72) Inventors: Anton Lischewski, Halle (DE); Ludwig Adelmann, Petershagen (DE); Dietmar Kloepper, Bueckeburg (DE)

(73) Assignee: WAGO Verwaltungsgesellschaft mit beschraenkter Haftung, Minden (DE)

( * ) Notice: Subject to any disclaimer, the term of this patent is extended or adjusted under 35 U.S.C. 154(b) by 0 days.

(21) Appl. No.: 17/099,654

(22) Filed: Nov. 16, 2020

(65) Prior Publication Data
US 2021/0152172 A1  May 20, 2021

(30) Foreign Application Priority Data
Nov. 15, 2019 (DE) .................. 20 2019 106 358.0

(51) Int. Cl.
*H03K 17/18* (2006.01)
*H03K 17/945* (2006.01)

(52) U.S. Cl.
CPC .......... *H03K 17/18* (2013.01); *H03K 17/945* (2013.01); *H03K 2017/9455* (2013.01); *H03K 2217/0027* (2013.01)

(58) Field of Classification Search
CPC .............. H03K 17/18; H03K 17/945; H03K 2017/9455; H03K 2217/0027

USPC ........................................................ 307/116
See application file for complete search history.

(56) References Cited

U.S. PATENT DOCUMENTS

| | | | | |
|---|---|---|---|---|
| 5,633,680 A * | 5/1997 | Kaneko | ..................... | G02B 7/08 |
| | | | | 348/357 |
| 5,763,961 A * | 6/1998 | Dreyer | .................... | H03K 17/94 |
| | | | | 307/116 |
| 6,337,523 B1 * | 1/2002 | Fischetti | .............. | H03K 17/941 |
| | | | | 307/116 |
| 8,275,472 B2 | 9/2012 | Roth et al. | | |
| 2003/0200323 A1 | 10/2003 | Dold et al. | | |
| 2014/0229019 A1 * | 8/2014 | Widgren | .................. | F24F 11/63 |
| | | | | 700/276 |

FOREIGN PATENT DOCUMENTS

DE  10211939 A1  10/2003
DE  10221772 A1  11/2003

* cited by examiner

*Primary Examiner* — Tomi Skibinski
(74) *Attorney, Agent, or Firm* — Muncy, Geissler, Olds & Lowe, P.C.

(57) ABSTRACT

A module having an input configured to connect a sensor and having an indicator configured to optically indicate a physical state of the sensor. The module is configured to transmit a logical signal associated with the physical state or an inverted logical signal of the sensor to a higher-level unit and to receive a control value from the higher-level unit. The module is configured to evaluate the control value and to determine, on the basis of the control value, whether the value of the logical sensor signal or the inverted logical sensor signal is to be used for the optical indication of the physical state of the sensor.

13 Claims, 6 Drawing Sheets

Fig. 7

MODULE INCLUDING AN INDICATOR FOR INDICATING A PHYSICAL STATE OF A SENSOR CONNECTED TO THE MODULE

This nonprovisional application claims priority under 35 U.S.C. § 119(a) to German Patent Application No. 20 2019 106 358.0, which was filed in Germany on Nov. 15, 2019, and which is herein incorporated by reference.

BACKGROUND OF THE INVENTION

Field of the Invention

The present invention relates to a module including a device for indicating a physical state of a sensor connected to the module. In particular, the present invention relates to a field bus system having a modular field bus node, which comprises a module including a device for indicating a physical state of a sensor connected to the module.

Description of the Background Art

In a field bus system, sensors and actuators may be connected to a higher-level unit via field bus nodes. For example, the sensors and/or actuators may be connected to one or multiple modules (input/output modules, I/O modules), which, in turn, form one or multiple field bus nodes. To test the function of the connected sensors, a module may be provided with an indicator, with the aid of which the physical state of the sensor may be visualized.

For example, proximity sensors exist, which emit a switching signal once the sensor detects an approach below its physical threshold (mechanically, optically, capacitively, inductively, etc.). In the case of positive-switching sensors, the particular input is connected in this case to the reference potential (0V) of the module, while negative-switching sensors interrupt an existing connection between the input and 0V.

SUMMARY OF THE INVENTION

To test the function of a proximity sensor, it may be advantageous to have the physical state of the sensor (in the vicinity of the sensor) indicated and thereby to detect whether somethings has or has not (yet) approached the proximity sensor below its physical threshold. Based on the switching state or the emitted electrical signal (the signal state), which the proximity sensor emits in this case, it is, however, not possible to directly infer its physical state if it is not known whether the sensor is a positive-switching or negative-switching one.

A module according to an exemplary embodiment of the invention comprises an input, configured to connect a sensor, and an indicator, in particular a light source, configured to optically indicate a physical state of the sensor. The module is configured to transmit a logical signal associated with the physical state or an inverted logical signal of the sensor to a higher-level unit and to receive a control value from the higher-level unit. The module is further configured to evaluate the control value and to determine, on the basis of the control value, whether the value of the logical sensor signal or of the inverted logical sensor signal is to be used for the optical indication of the physical state of the sensor.

The term "module," may be understood to be, for example, a device connected in series to a further module or a head station or connected in series during operation, which connects one or multiple field devices to the head station and possibly to the higher-level control unit (via the head station). In this context, the term "field device," may be understood to be, for example, sensors and/or actuators connected (via signals) to the module (e.g. connected at the module). Furthermore, the term "input," may be understood to be, for example, an electrical connection, for example a connecting terminal.

Moreover, the term "indicator," may be understood to be, for example, a device which makes it possible to signal different physical states of the sensor by emitting light. For example, the indicator may emit light of different colors or light pulses which differ with respect to a time pattern for the purpose of signaling different physical states. For example, more or fewer light pulses may be emitted within a certain period of time. For example, physical states may be signaled by slow(er) flashing if no approach is detected and by fast(er) flashing if an approach is detected. In this context, the term "physical state," may be understood to be, for example, a change in the surrounding area detected by the sensor. Within the meaning of the invention, this physical state is to be distinguished from the signal which represents the physical state and which may vary between different sensors.

In addition, the term "logical signal," may be understood to be, for example, an electrical signal which is generated and evaluated in such a way that or whether a voltage embodying the signal or a current embodying a signal is in a first area or a second area, the first area and the second area being separable by a third area (safety distance). In this context, the term "inverted logical signal," may be understood to be, for example, an electrical signal which differs from the logical signal in that a voltage embodying the inverted logical signal or a current embodying the inverted logical signal is in the second range, if a voltage embodying the logical signal or a current embodying the logical signal is in the first range and vice versa.

Furthermore, the wording "the module being configured to transmit a logical signal or an inverted logical signal to a higher-level unit and to receive a control value from the higher-level unit," may be understood to be, for example, the presence of an interface (for example, a field bus interface), with the aid of which the module may transmit messages (directly or indirectly) to the higher-level unit. Moreover, the term "higher-level unit," may be understood to be, for example, a higher-level controller, which derives control signals for one or multiple actuators from the physical state of one or multiple sensors.

Furthermore, the term "control value," may be understood to be, for example, a logical value derived from a voltage or current profile. Moreover, the instruction "to determine, on the basis of the control value, whether the value of the logical sensor signal or of the inverted logical sensor signal is to be used for the optical indication of the physical state of the sensor," may be understood to be, for example, the interchanging of an assignment between the areas, in which the voltage present at the input or the current input via the input is situated, and the optical signal patterns which may be output via the indicator.

The module preferably includes a register, in which the control value may be stored.

For example, the module may include one or multiple registers, and an area in the or one register may be assigned to each input.

The module can be configured to transmit the logical signal to the higher-level unit in an inverted manner or to transmit it to the higher-level unit in a non-inverted manner, based on the control value.

The sensor and the module may be part of a system, in which the sensor is used as a switch.

For example, the switch may be designed as a proximity switch.

The system may further comprise a head station, the module being connected in series to the head station.

The term "head station," may be understood to be, for example, a component of a modular field bus node, whose task is to make the data and/or the services of the modules connected in series to the head station available to additional field bus users (for example, the higher-level control unit) via a field bus interface and a field bus connected to the field bus interface.

The module and the sensor connected to the module may be part of a modular field bus node, which is disposed in a field bus system, which includes a higher-level unit and a field bus, via which the module of the field bus node is connected to the higher-level unit, the field bus system being able to be configured to transmit the logical sensor signal or the inverted logical sensor signal from the module to the higher-level unit.

The logical sensor signal can be one part of a process representation, and the process representation comprises a value, which indicates whether the sensor is in an error state, the module being configured to indicate the error state with the aid of the indicator if the sensor is in an error state.

The module can include a large number of indicators for connecting a large number of sensors, each of which is either positive-switching or negative-switching, and the higher-level unit comprises data, which indicate which of the sensors is positive-switching and which of the sensors is negative-switching.

The higher-level unit can be configured to tell the module to switch either the indicators assigned to the positive-switching sensor or the indicators assigned to the negative-switching sensors, based on inverted sensor signals.

The sensors can be designed as switches which switch from a first state into a second state, if a measured value exceeds a threshold, and to switch back from the second state into the first state, if the measured value drops below the threshold or a further threshold.

The higher-level unit can be configured to determine a control signal, based on the logical sensor signal, and to transmit the control signal to the modular field bus node.

It is understood that the steps carried out by the module or the (field bus) system may be understood as steps of a corresponding method, which is implemented using the module or the (field bus) system, and vice versa.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
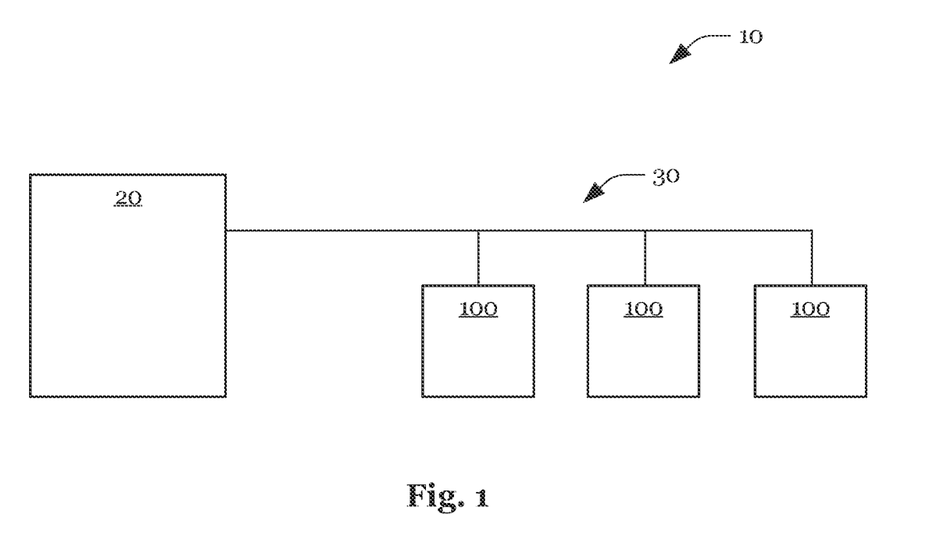
FIG. 1 schematically shows the structure of a field bus system.

FIG. 1 shows a block diagram of a field bus system 10. Field bus system 10 comprises a large number of field bus nodes 100, which are connected to higher-level (control) unit 20 via a field bus 30. Higher-level unit 20 may be used to monitor as well as to regulate a system (not illustrated), which is monitored or controlled by field bus system 10. If higher-level unit 20 monitors a system, higher-level unit 20 may receive status data (hereinafter referred to as input process representation) from field bus node 100 cyclically or acyclically, which describes the status of the system and generates an error signal or an alarm signal, if the status of the system (substantially) deviates from a desired/permitted status or status range. If higher-level unit 20 (not only monitors but also) regulates the system, higher-level unit 20 may receive status data from field bus nodes 100 cyclically or acyclically and ascertain control data (hereinafter also referred to as output process representation) transmitted to field bus nodes 100, taking into account the status data.

Figure 2:
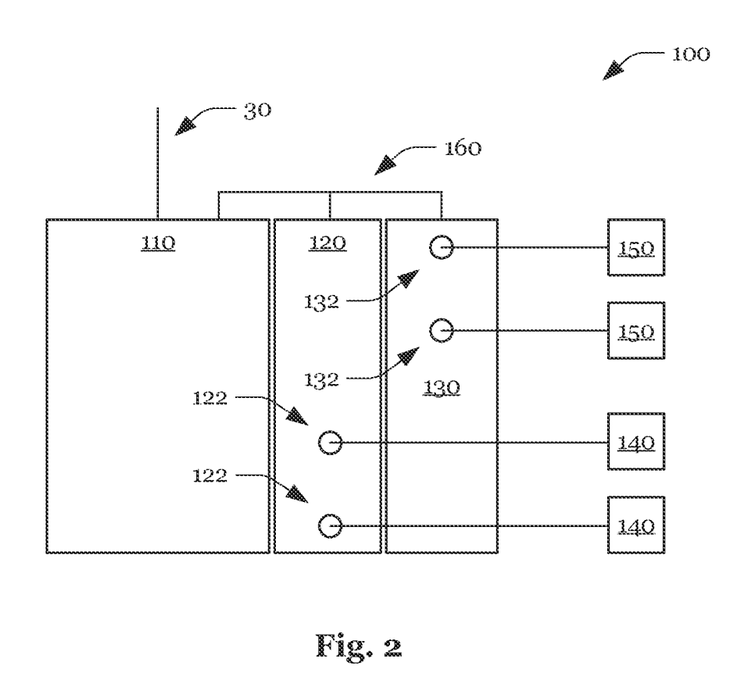
FIG. 2 schematically shows the structure of a field bus node of the field bus system.

FIG. 2 shows an example of a modular field bus node 100, including a head station 110 and two modules 120, 130 connected in series to head station 110, to which sensors 140 and actuators 150 are connected. During operation, module 120 reads in sensor signals via inputs 122 and generates status data from the sensor signals, which is transmitted to head station 110 via local bus 160. Head station 110 may process the status data locally and/or forward it (possibly in modified form) to higher-level unit 20. Higher-level unit 20 (or head station 110 in the case of local processing) may then generate control data, taking the status data into account.

The control data generated by higher-level unit 20 may be transmitted to (the same) or (another) head station 110 via field bus 30. The control data transmitted to head station 110 (or generated by head station 110) may then be forwarded/transmitted to module 130 (possibly in modified form). Module 130 receives the control data and outputs control signals corresponding to the control data to outputs 132, to which actuators 150 are connected. The communication of data between the components of field bus system 10 and the mapping of the sensor signals to status data and the mapping of control data to control signals may be adapted to different use scenarios by a configuration of field bus nodes 100.

Figure 3:
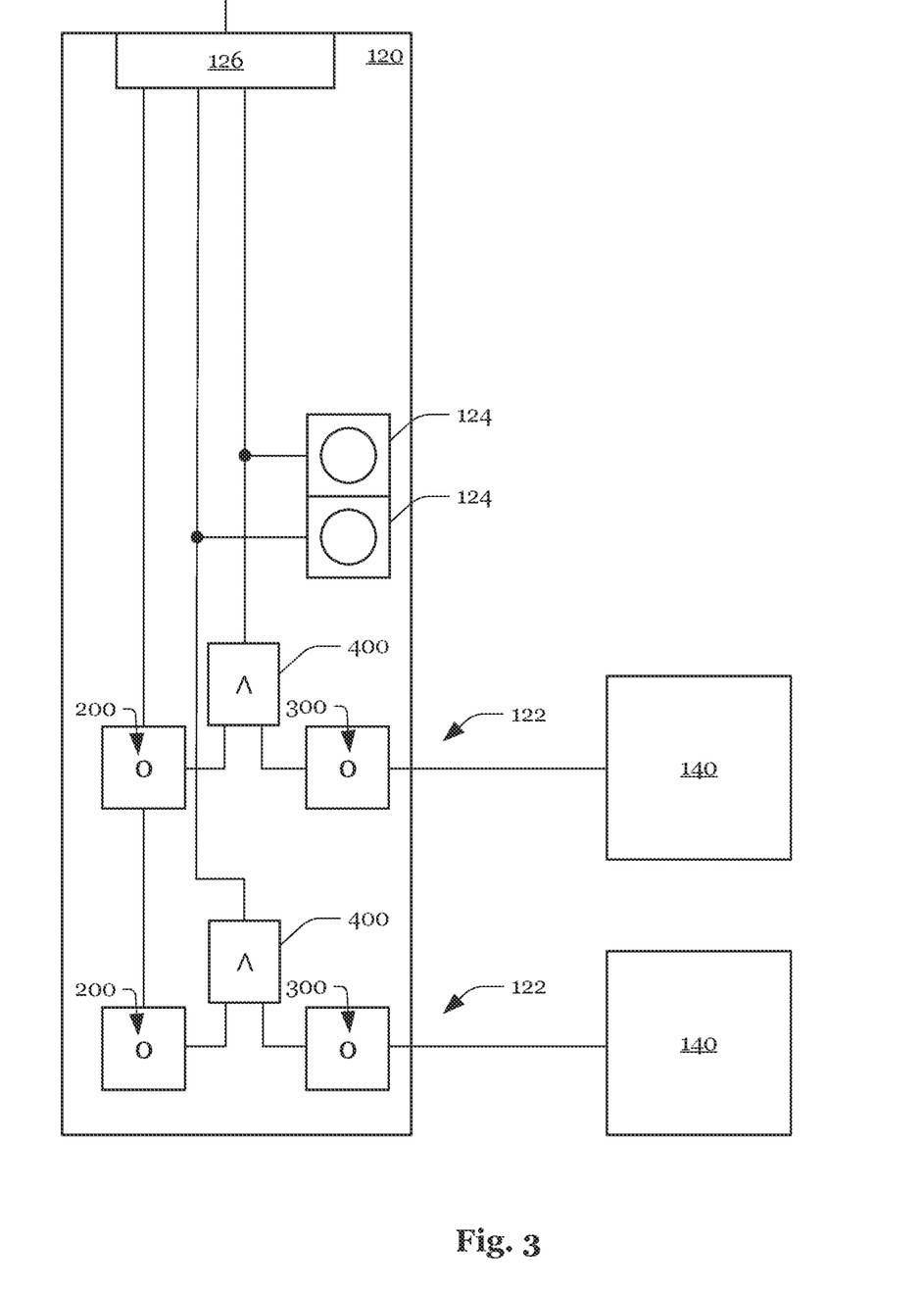
FIG. 3, FIG. 4, FIG. 5 and FIG. 6 show aspects of the operation of a module of the field bus node.

FIG. 3 shows an exemplary design of module 120. Module 120 comprises multiple indicators 124 (for example, LEDs), configured to optically indicate the physical state of sensors 140. Module 120 receives control values 200 from higher-level unit 20 and stores them in an input register, one control value 200 being assigned to each input 122. As illustrated in FIG. 3, control values 200 may be logical values, which indicate how a logical signal generated by sensor 140 connected to particular input 122 behaves with respect to the physical state of sensor 140. For example, if two identical sensors 140 are connected to module 120 in the specific embodiment shown in FIG. 3 (which correspondingly generate identical logical signals 300 in identical scenarios), control values 200 assigned to inputs 122 may also be identical. However, if two sensors 140 are connected to module 120, as in the specific embodiment shown in FIG. 4, which generate inverse logical signals 300 with respect to each other in identical scenarios, this may be compensated for by corresponding control values 200 assigned to inputs 122.

Figure 4:
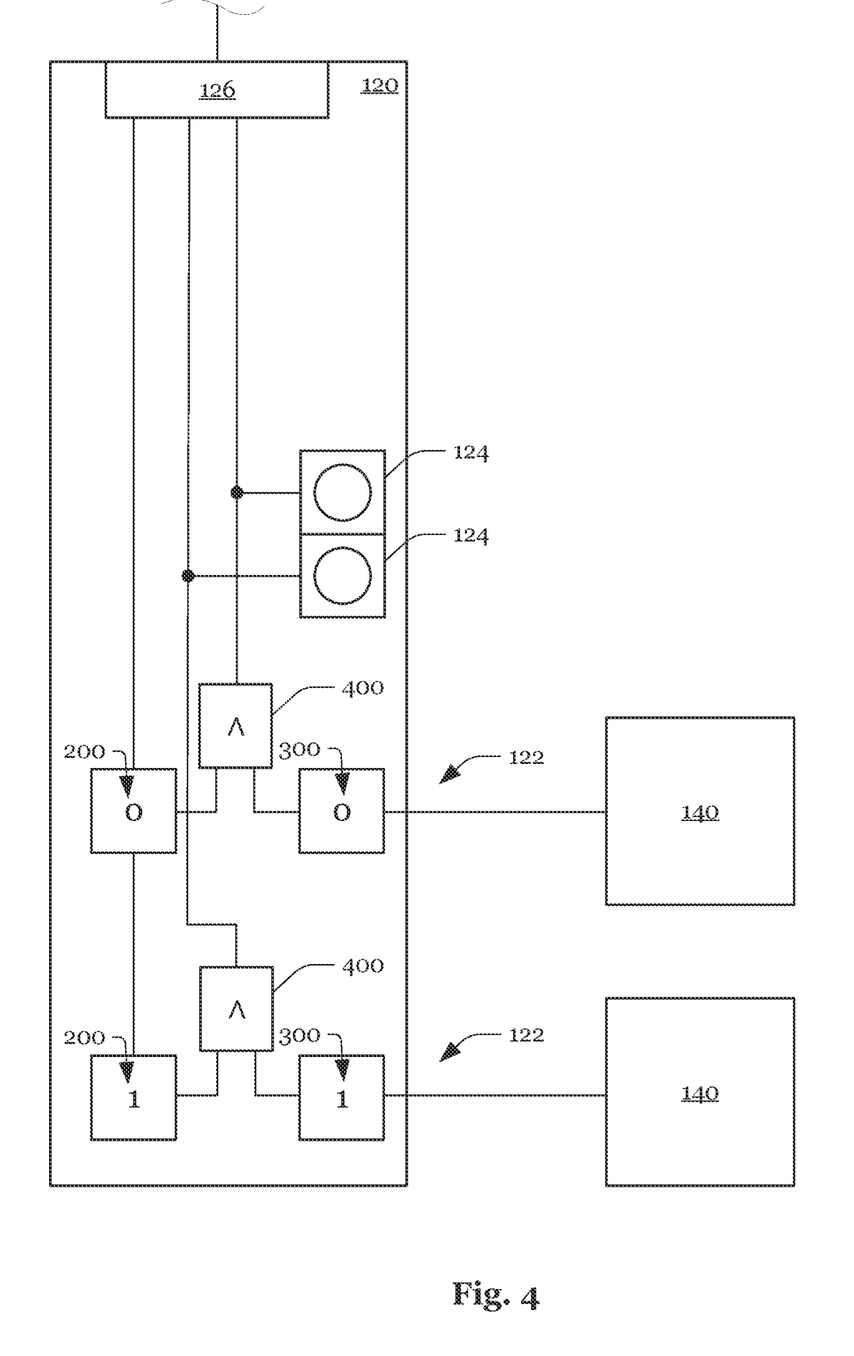

As illustrated in FIG. 4, control value 200 assigned to an input 122 and logical signal 300 input via input 122 may be linked with the aid of a logic operation 400 in such a way that identical logical signals are generated in identical scenarios by logic operation 400. As a result, module 120 provides logic signal 400 associated with the physical state or the inverted logical signal to higher-level unit 20. In addition, control value 200 may also be used to determine whether the value of logical sensor signal 300 or of the inverted sensor signal is to be used for the optical indication of the physical state of sensor 140.

Figure 5:
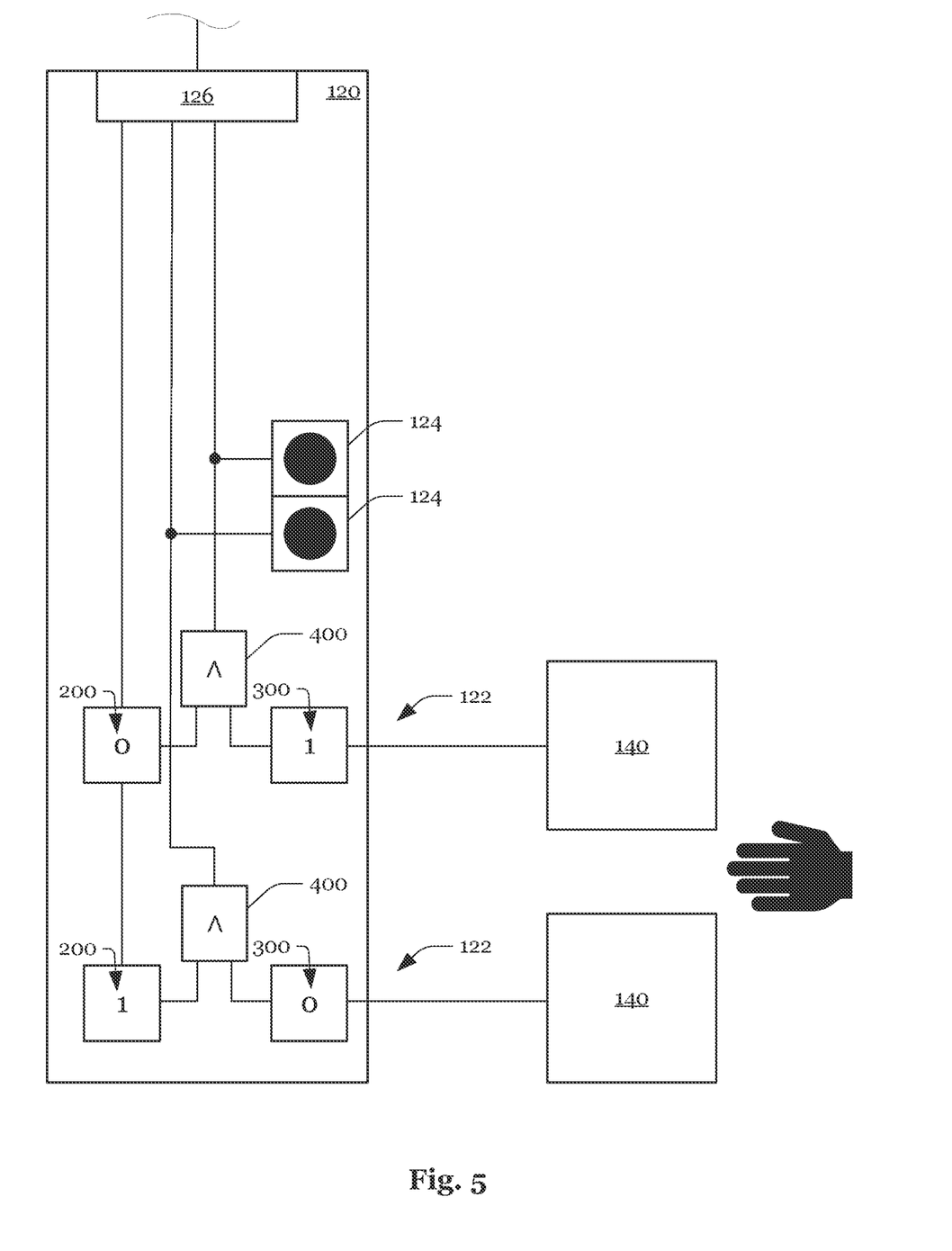
Figure 6:
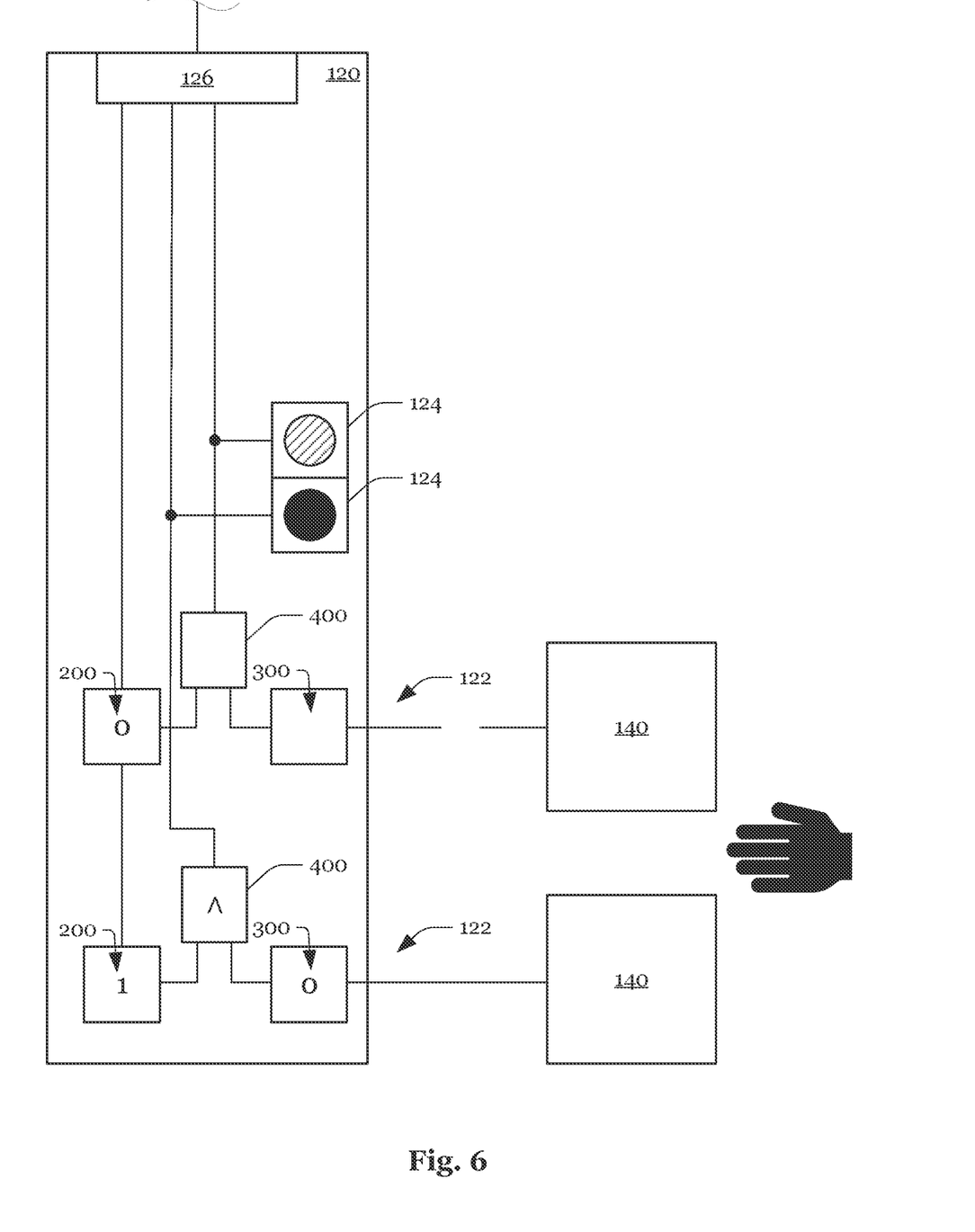

This makes it possible to achieve the fact that indicators 124 show the physical state of both sensors 140 in the same manner, for example for proximity sensors which generate inverse logical signals 300 as a function of an approach of an object (such as a hand), as illustrated in FIG. 5. This is advantageous, for example, if the function of sensors 140 is to be checked with the aid of indicators 124. As shown in FIG. 6, an indicator 124 may also be used to indicate an error state, the indicator 124 being required to not indicate either logical sensor signal 300 or the inverted logical sensor signal in this case. Module 120 may be provided with a channel-by-channel short-circuit and wire breakage diagnosis to detect an error state. In this case, indicator 124 may be designed as a two-colored LED, which indicates the signal state as well as a short-circuit or a wire breakage.

Figure 7:
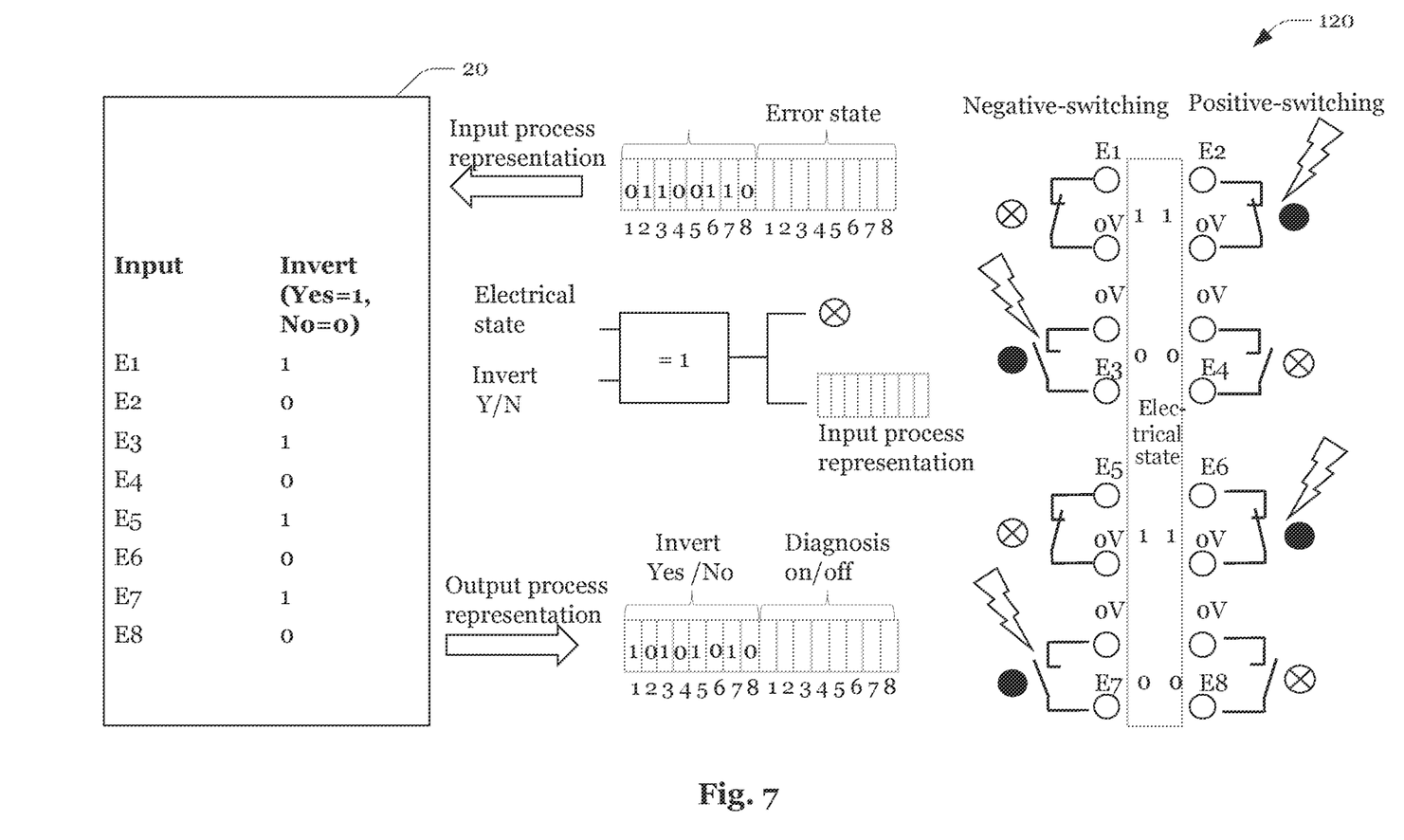
FIG. 7 shows further aspects of the operation of a module.

FIG. 7 shows a modification of module 120 described in connection with FIG. 3 through FIG. 6. Sensors 140 are connected at module 120, which emit a switching signal as a function of a measured variable. For example, sensors 140 may be designed as proximity sensors, which emit a switching signal once sensor 140 detects an approach below its physical threshold (mechanically, optically, capacitively, inductively, etc.). As illustrated in FIG. 7, positive-switching sensors 140 connect input 122 to the 0V potential of module 120 upon an approach below the physical threshold, while negative-switching sensors 140 disconnect input 122 from the 0V potential.

Module 120 transmits an input process representation to higher-level unit 20 via interface 126 and receives an output process representation from higher-level unit 20 (via interface 126). A fixed number of bits (one per sensor 140, i.e. 8 bits) of the input process representation characterizes the signal state of particular inputs 122. An identical number of further bits signal a possible error state to the controller program. Bits of the output process representation may be used to enable the particular error state (diagnosis on/off). For each input 122, a further bit of the output process representation (i.e. 8 bits) may be used to indicate whether the signal state of particular inputs 122 must be inverted so that, for example, all indicators 124 show the physical state of identical or similar sensors 140 in the same manner. The output process representation may be transmitted to module 120 once in each control cycle, likewise the enabling of the error state. No parameter with respect to the type of connected sensors 140 thus needs to be stored in module 120, but instead it is sufficient if the parameters with respect to the type of connected sensors 140 are stored in higher-level unit 20.

If the diagnosis is activated, and if a sensor 140 is in an error state, the short-circuit and wire breakage diagnosis may place input 122 of downstream devices into a state, in which the error state is signaled to the input process representation via indicator 124. During normal operation, the signal state, on the other hand, may be signed with the aid of indicator 124.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A module comprising:
    an input configured to connect a sensor; and
    an indicator configured to optically indicate a physical state of the sensor,
    wherein the module is configured to transmit a logical signal associated with the physical state or an inverted logical signal of the sensor to a higher-level unit and to receive a control value from the higher-level unit, and
    wherein the module is configured to evaluate the control value and to determine, on the basis of the control value, whether the value of the logical sensor signal or the inverted logical sensor signal is to be used for the optical indication of the physical state of the sensor.

2. The module according to claim 1, wherein the module includes a register, in which the control value is stored.

3. The module according to claim 1, wherein the module is configured to transmit the logical signal to the higher-level unit in an inverted manner or to transmit it to the higher-level unit in a non-inverted manner, based on the control value.

4. A system, comprising:
    a module according to claim 1; and
    a sensor configured as a switch.

5. The system according to claim 4, wherein the switch is a proximity switch.

6. The system according to claim 4, further comprising:
    a head station, wherein the module is connected in series to the head station.

7. A field bus system comprising:
    a modular field bus node, which includes a module according to claim 1;
    a sensor connected to an input;
    a higher-level unit; and
    a field bus, via which the module of the field bus node is connected to the higher-level unit,
    wherein the field bus system is configured to transmit a logical sensor signal or an inverted logic sensor signal from the module to the higher-level unit.

8. The field bus system according to claim 7, wherein the logical sensor signal is one part of a process representation, and the process representation comprises a value, which indicates whether the sensor is in an error state, and wherein the module is configured to indicate the error state with the aid of the indicator if the sensor is in an error state.

9. The field bus system according to claim 7, wherein the module includes a plurality of indicators for connecting a plurality of sensors, which are each either positive-switching or negative-switching, and wherein the higher-level unit comprises data, which indicates which of the sensors is positive-switching, and which of the sensors is negative-switching.

10. The field bus system according to claim 9, wherein the higher-level unit is configured to tell the module to switch either the indicators assigned to the positive-switching sensors or the indicators assigned to the negative-switching sensors based on inverted sensor signals.

11. The field bus system according to claim 10, wherein the sensors are switches, which switch from a first state into a second state if a measured value exceeds a threshold, and which switch back from the second state into the first state if the measured value drops below the threshold or a further threshold.

12. The field bus system according to claim 7, wherein the higher-level unit is configured to determine a control signal, based on the logical sensor signal, and to transmit the control signal to the modular field bus node.

13. The module according to claim 1, wherein the indicator is a light source.

* * * * *